(12) United States Patent
Kanai et al.

(10) Patent No.: US 7,565,879 B2
(45) Date of Patent: *Jul. 28, 2009

(54) PLASMA PROCESSING APPARATUS

(75) Inventors: Saburo Kanai, Hikari (JP); Kazue Takahashi, Kudamatsu (JP); Kouichi Okamura, Tokuyama (JP); Ryoji Hamasaki, Hikari (JP); Satoshi Ito, Hikari (JP)

(73) Assignee: Hitachi, Ltd, Tokyo (JP)

( * ) Notice: Subject to any disclaimer, the term of this patent is extended or adjusted under 35 U.S.C. 154(b) by 514 days.

This patent is subject to a terminal disclaimer.

(21) Appl. No.: 10/953,539

(22) Filed: Sep. 30, 2004

(65) Prior Publication Data

US 2005/0064717 A1 Mar. 24, 2005

Related U.S. Application Data

(63) Continuation of application No. 10/617,019, filed on Jul. 11, 2003, now abandoned, which is a continuation of application No. 09/983,946, filed on Oct. 26, 2001, now Pat. No. 6,815,365.

(51) Int. Cl.
  *C23C 16/511* (2006.01)
  *C23C 16/52* (2006.01)
  C23C 16/22 (2006.01)
  C23C 16/06 (2006.01)

(52) U.S. Cl. .............. 118/723 MW; 118/663; 118/666; 156/345.24; 156/345.27; 156/345.36; 156/345.37

(58) Field of Classification Search ......... 118/723 MW, 118/663, 666; 156/345.24, 345.27, 345.36, 156/345.37

See application file for complete search history.

(56) References Cited

U.S. PATENT DOCUMENTS 4,209,357 A 6/1980 Gorin et al.

(Continued)

FOREIGN PATENT DOCUMENTS

DE 40 07 123 A1 9/1991

(Continued)

OTHER PUBLICATIONS

Machine Translation: JP 05144773 A—http://www4.ipdl.inpit.go.jp/Tokujitu/PAJdetail.ipdl?N0000=60&N0120=01&N2001=2&N3001=H05-144773.*

(Continued)

*Primary Examiner*—Rudy Zervigon
(74) *Attorney, Agent, or Firm*—Antonelli, Terry, Stout & Kraus, LLP.

(57) ABSTRACT

A plasma processing apparatus having a plasma generating unit, a process chamber including an outer cylinder for withstanding a reduced pressure, and an inner cylinder made of non-magnetic material and being replaceable, arranged inside the outer cylinder, a process gas supply unit for supplying gas to the process chamber, a specimen table for holding a specimen and a vacuum pumping unit. A temperature monitoring unit monitors temperature of the inner cylinder, and a controller controls temperature of the outer cylinder. A desired inner cylinder temperature which is inputted in advance in response to a processing condition of the specimen is compared with the monitored temperature of the inner cylinder, and the controller controls the temperature of the outer cylinder in response to a result of the comparison so as to control the inner cylinder temperature to a predetermined value.

4 Claims, 9 Drawing Sheets

U.S. PATENT DOCUMENTS

| | | | |
|---|---|---|---|
| 5,270,222 A * | 12/1993 | Moslehi | 438/7 |
| 5,272,417 A | 12/1993 | Ohmi | |
| 5,283,414 A | 2/1994 | Straemke | |
| 5,290,381 A | 3/1994 | Nozawa et al. | |
| 5,314,541 A * | 5/1994 | Saito et al. | 118/725 |
| 5,356,672 A | 10/1994 | Schmitt, III et al. | |
| 5,362,361 A | 11/1994 | Tatsumi | |
| 5,366,585 A | 11/1994 | Robertson et al. | |
| 5,445,709 A | 8/1995 | Kojima et al. | |
| 5,478,429 A | 12/1995 | Komino et al. | |
| 5,529,632 A * | 6/1996 | Katayama et al. | 118/723 MP |
| 5,531,834 A | 7/1996 | Ishizuka et al. | |
| 5,571,366 A | 11/1996 | Ishii et al. | |
| 5,591,493 A | 1/1997 | Paranjpe et al. | |
| 5,647,945 A | 7/1997 | Matsuse et al. | |
| 5,651,826 A | 7/1997 | Takagi | |
| 5,716,451 A | 2/1998 | Hama et al. | |
| 5,756,400 A | 5/1998 | Ye et al. | |
| 5,800,621 A | 9/1998 | Redeker et al. | |
| 5,843,277 A | 12/1998 | Goto et al. | |
| 5,846,331 A | 12/1998 | Miyamoto | |
| 5,874,012 A | 2/1999 | Kanai et al. | |
| 5,891,252 A | 4/1999 | Yokogawa et al. | |
| 6,024,826 A | 2/2000 | Collins et al. | |
| 6,054,013 A | 4/2000 | Collins et al. | |
| 6,055,927 A | 5/2000 | Shang et al. | |
| 6,063,233 A | 5/2000 | Collins et al. | |
| 6,068,784 A | 5/2000 | Collins et al. | |
| 6,095,084 A | 8/2000 | Shamoullian et al. | |
| 6,129,808 A | 10/2000 | Wicker et al. | |
| 6,171,438 B1 | 1/2001 | Masuda et al. | |

FOREIGN PATENT DOCUMENTS

| | | |
|---|---|---|
| EP | 0 488 307 A2 | 6/1992 |
| EP | 0 488 307 B1 | 6/1992 |
| EP | 0 272 140 B1 | 2/1994 |
| EP | 0 367 289 B1 | 2/1995 |
| EP | 0 648 858 A1 | 4/1995 |
| EP | 0 467 397 B1 | 12/1995 |
| EP | 0 688 037 B1 | 12/1995 |
| EP | 0 734 047 A2 | 9/1996 |
| JP | 56-67925 | 6/1981 |
| JP | 57-23228 | 2/1982 |
| JP | 58-153332 | 9/1983 |
| JP | 59-144132 | 8/1984 |
| JP | 62-95828 | 5/1987 |
| JP | 62-218570 | 9/1987 |
| JP | 63-5526 | 1/1988 |
| JP | 63-75034 | 5/1988 |
| JP | 1-208449 | 8/1989 |
| JP | 3-64025 | 3/1991 |
| JP | 3-104222 | 5/1991 |
| JP | 4-184924 | 7/1992 |
| JP | 4-214873 | 8/1992 |
| JP | 5-60256 | 3/1993 |
| JP | 05144773 A * | 6/1993 |
| JP | 5-211125 | 8/1993 |
| JP | 5-266845 | 10/1993 |
| JP | 6-188220 | 7/1994 |
| JP | 6-196410 | 7/1994 |
| JP | 7-22404 | 1/1995 |
| JP | 7-147247 | 6/1995 |
| JP | 7-312363 | 11/1995 |
| JP | 8-51099 | 2/1996 |
| JP | 8-144072 | 6/1996 |
| JP | 8-186093 | 7/1996 |
| JP | 9-157832 | 5/1997 |
| JP | 9-275092 | 10/1997 |

OTHER PUBLICATIONS

"Suppression Shield for RF Plasma", W. J. Curry et al, IBM Technical Disclosure Bulletin, vol. 22, No. 11, Apr. 1980, pp. 4909-4910.

* cited by examiner

FIG. 14

PLASMA PROCESSING APPARATUS

CROSS REFERENCE TO RELATED APPLICATION

This is a continuation of U.S. application Ser. No. 10/617,019, filed Jul. 11, 2003, which relates to U.S. application Ser. No. 10/619,020, filed Jul. 11, 2003, which are continuations of U.S. application Ser. No. 09/983,946, filed Oct. 26, 2001, which relates to U.S. application Ser. No. 10/647,319, filed Aug. 26, 2003, which is a continuation of U.S. application Ser. No. 09/984,052, filed Oct. 26, 2001, which relates to U.S. application Ser. No. 10/441,009, filed May 20, 2003, which is a continuation of U.S. application Ser. No. 09/421,044, filed Oct. 20, 1999, now abandoned, which relates to U.S. application Ser. No. 10/253,862, filed Sep. 25, 2002, which is a continuation of U.S. application Ser. No. 09/984,052, filed Oct. 26, 2001, now abandoned, which relates to U.S. application Ser. No. 09/421,044, filed Oct. 20, 1999, now abandoned, which is a continuation of U.S. application Ser. No. 09/983,946, filed Oct. 26, 2001, which relates to U.S. application Ser. No. 09/984,052, filed Oct. 26, 2001, now abandoned, which is a continuation of U.S. application Ser. No. 09/421,043, filed Oct. 20, 1999, which is a continuation of U.S. application Ser. No. 09/227,332, filed Jan. 8, 1999, now U.S. Pat. No. 6,171,438, which is a continuation-in-part of U.S. application Ser. No. 08/611,758, filed Mar. 8, 1996, now U.S. Pat. No. 5,874,012, the subject matter of U.S. application Ser. No. 08/611,758 being incorporated by reference herein.

BACKGROUND OF THE INVENTION

The present invention relates to a plasma processing apparatus and a plasma processing method; and, more particularly, the invention relates to a plasma processing apparatus and a plasma processing method suitable for processing a specimen, such as etching a specimen using a high density plasma.

In a conventional plasma processing apparatus, as described, for example, in Kanno, T., Semiconductor Plasma Processing Technology, Sangyou-Tosho Company (1980), page 139, using a microwave plasma processing apparatus, which has a quartz discharge chamber in a waveguide transmitting a microwave, plasma is generated in the discharge chamber by action of an outer magnetic field generated by a coil arranged outside of the discharge chamber and a microwave electric field. Thereby, processing, such as etching of a surface of a semiconductor wafer, can be performed using the plasma.

For a processing chamber in such a microwave etching apparatus, a non-magnetic and conductive material used as the waveguide is necessary to guide the microwave energy and to introduce the outer magnetic field in the processing chamber. Therefore, a metal, such as aluminum (Al) or a stainless steel (SUS), is commonly used for the wall material of the processing chamber.

However, a metal, such as a stainless steel or the like, composing the wall surface of the processing chamber, becomes worn and dispersed by the plasma, and the heavy weight metals contained in the material become a contamination source.

A technology is disclosed in Japanese Patent Application Laid-Open No. 4-229619 (1992) where a conductive coating film capable of protecting a metallic surface from chemical corrosion by a reaction gas used in a processing chamber is formed on the metallic inner surface. In accordance with this technology, a protective film is formed on the metallic inner wall surface of the processing chamber through coating, since the metallic inner wall surface may be corroded when plasma etching is performed by using a halogen gas, such as chlorine, as the processing gas. Aluminum is used as the material for the processing chamber, and TiN, InSn, SiC, TiC, TaC or the like is used for the coating material. The thickness of the coating film is 0.2 μm to 1 μm.

Further, a dry etching apparatus having opposed electrodes inside a chamber is disclosed in Japanese Patent Application Laid-Open No. 63-138737 (1988), wherein the inside surface of the chamber is covered with an insulator material detachable from the chamber in order to keep a contaminated inner surface of the chamber clean. As the insulator material, there is used alumite, alumina thermal spraying, teflon, ceramic or the like.

The above conventional technology disclosed in Japanese Patent Application Laid-Open No. 4-229619 (1992) can protect the metallic surface from chemical corrosion due to the reaction gas used in the processing chamber. However, as for the typical condition of the plasma etching process, it is clear that the temperature during plasma processing is limited to a relatively low temperature range of approximately 10° C. to approximately 70° C. The reason why this temperature limitation is set seems to be that cracks may occur in the coating film on the aluminum surface due to the thermal expansion of the aluminum if the temperature of the aluminum composing the process chamber rises above 100° C. during plasma processing. In order to avoid the occurrence of cracks, the thickness of the coating film must be reduced. However, if the thickness of the film is reduced, the coating film cannot perform its function, since it will be corroded out in a short time by the reaction gas generated during plasma etching. For example, data according to an experiment conducted by the inventors shows that an SiC film is worn off at a speed of approximately 0.05 μm/minute during etching. This means that a coating film having a thickness of 0.2 μm to 1 μm is damaged and eliminated in several hours, that is, during a time when several hundreds of specimens have been processed. As a result, the metallic surface of the inner wall of the process chamber is exposed to the plasma and worn off by the plasma or has its quality altered due to chemical reaction. The worn-off metal becomes a heavy metal contamination source and the quality-altered metallic wall degrades the characteristic of the process chamber.

On the other hand, in the invention disclosed in Japanese Patent Application Laid-Open No. 63-138737 (1988), a contaminated isolator member is dismounted from a chamber and cleaned, and then re-mounted in the chamber to be used again. However, in a system where an insulator member is mounted onto the inner surface of a chamber, there is a problem in that the plasma processing characteristic largely fluctuates because the temperature of the mounted insulator member fluctuates during plasma processing.

SUMMARY OF THE INVENTION

An object of the present invention is to provide a plasma processing apparatus and a plasma processing method in which the characteristic of plasma processing is stabilized over time by preventing the inner surface of the process chamber from having its quality altered and from becoming a heavy metal contamination source, and by maintaining the temperature of the inner surface of the process chamber at a given temperature.

The present invention is characterized by a plasma processing apparatus comprising a plasma generating unit, a process chamber capable of having its inside pressure reduced, a process gas supply unit for supplying a gas to the process chamber, a specimen table for holding a specimen, and a vacuum pumping unit, wherein the process chamber comprises an outer cylinder having the capability of withstanding a reduced pressure, an inner cylinder arranged inside the outer cylinder through a gap, and a temperature controlling means for maintaining the temperature of the inner cylinder within a given temperature range.

The present invention is also characterized by a plasma processing apparatus as described above, wherein the process chamber comprises an outer cylinder having the capability of withstanding a reduced pressure, an inner cylinder arranged inside the outer cylinder through a gap, a temperature controlling means arranged in the outer cylinder, and a heat transmission means for transmitting heat between the outer cylinder and the inner cylinder arranged in the gap.

Further, the present invention is characterized by a plasma processing method of processing a specimen using a plasma processing apparatus comprising a plasma generating unit, a process chamber capable of having its inside pressure reduced, a process gas supply unit for supplying a gas to the process chamber, a specimen table for holding a specimen, and a vacuum pumping unit, wherein the process chamber comprises an outer cylinder having the capability of withstanding a reduced pressure, an inner cylinder arranged inside the outer cylinder through a gap, a temperature controlling means arranged in the outer cylinder, and a heat transmission means for transmitting heat between the outer cylinder and the inner cylinder arranged in the gap, and wherein plasma processing is performed on the specimen while the temperature of the inner cylinder is being kept within a given temperature range.

Still further, the present invention is characterized by a plasma processing method as described above, wherein the inner cylinder is made of a non-magnetic material not containing heavy metals, or is made of a material selected from a group of ceramic, carbon, silicon, quartz and metal materials, and plasma processing is performed on said specimen while the temperature of said inner cylinder is being kept within a given temperature range.

According to the present invention, since the inner cylinder used as the inner wall of the process chamber, which is made of a material not containing heavy metals, such as a ceramic, a metallic surface such as aluminum composing the outer cylinder is not exposed during the processing of a wafer.

Therefore, the wall never becomes a heavy metal contamination source by being worn or changed in quality by the plasma. On the other hand, since the thermal conductivity of the inner cylinder is lower than that of the outer cylinder, the temperature of the inner cylinder, that is, the surface temperature of the process chamber, may be raised up to 200° C. to 350° C. during etching process if the temperature is not controlled. In accordance with the present invention, since the temperature of the inner cylinder is controlled to a desired temperature, for example, a desired temperature between 100° C. to 350° C., the surface temperature of the process chamber can be kept to a desired temperature and the etching characteristic is also kept stable.

Further, it is also possible to stabilize the process by controlling the surface temperature of the inner cylinder in a desired pattern.

Furthermore, in a case of employing such a material composing the cylinder that the inner side surface of the material is worn bit by bit by plasma, since the inside surface of the inner cylinder is always renewed to a new surface, there is no worry about contamination due to a change in quality of the inside surface, and accordingly there is no time-change in the characteristic of the process chamber. In addition to this, since the inner cylinder does not contain any heavy metals, there is no worry that the inner cylinder becomes a contamination source even if it is worn.

DETAILED DESCRIPTION OF THE PREFERRED EMBODIMENTS

Embodiments of the present invention will be described in detail below, referring to the accompanying drawings.

Figure 1:
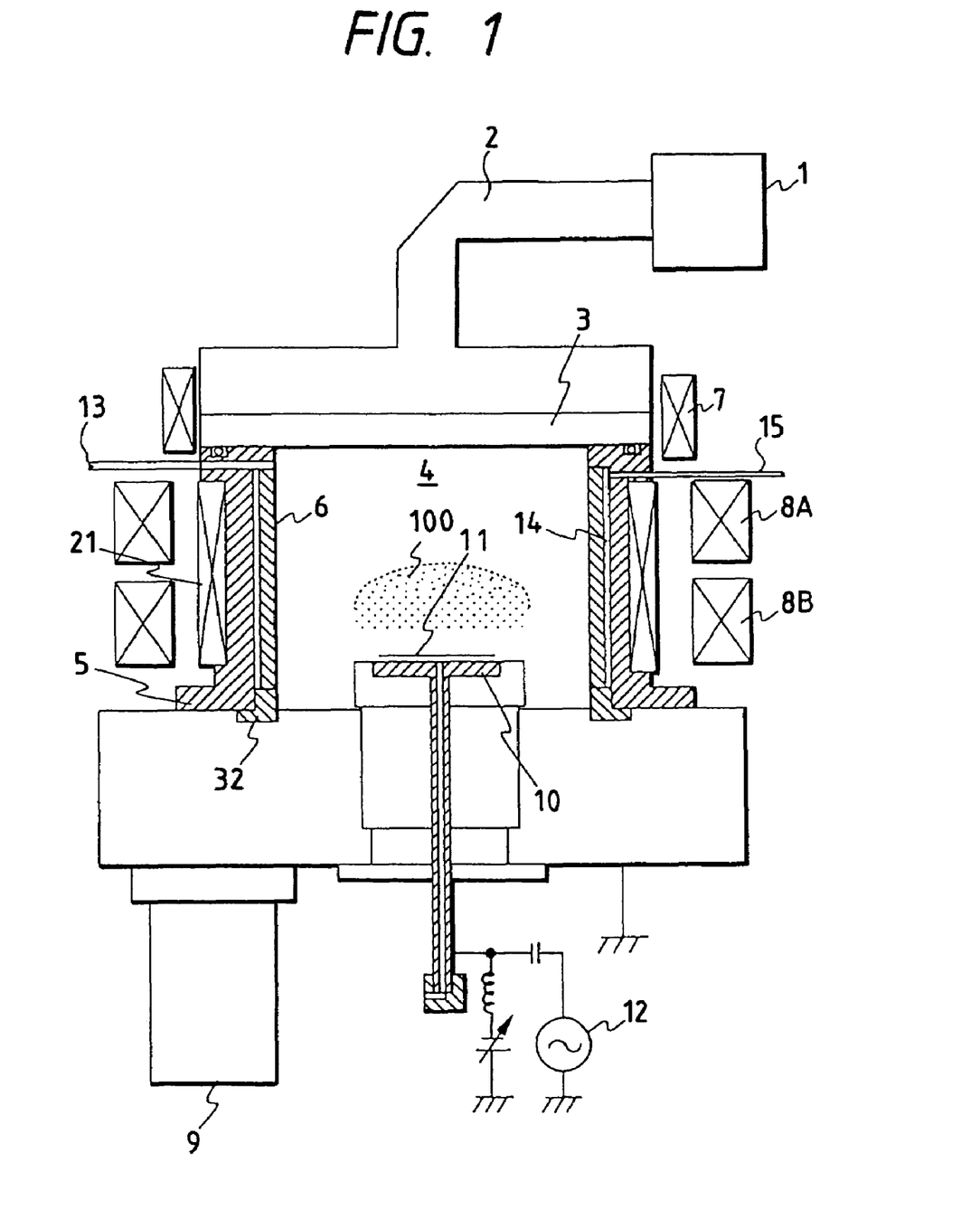
FIG. 1 is a partial cross-sectional vertical front view showing an embodiment of a microwave plasma processing apparatus in accordance with the present invention.
Figure 2:
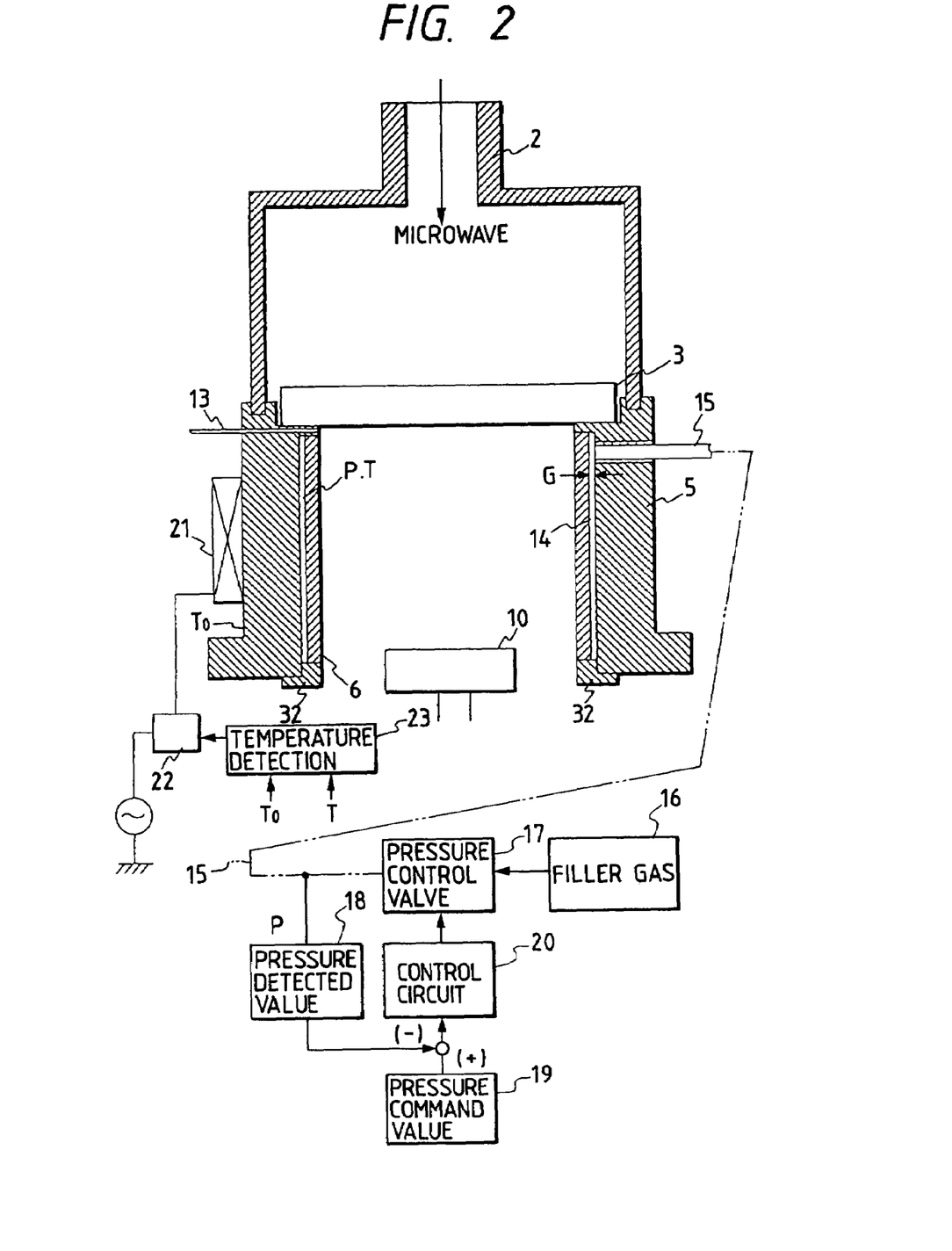
FIG. 2 is an enlarged view showing the main part of the temperature controller for the inner cylinder shown in FIG. 1.

FIG. 1 is a partial cross-sectional vertical front view showing an embodiment of a microwave plasma processing apparatus in accordance with the present invention, and FIG. 2 is an enlarged view showing the main part of the apparatus. The reference character 1 designates a magnetron operating as a microwave oscillator source, and the reference character 2 designates a guide tube for microwave energy. The reference character 3 designates a quartz plate for permitting the supply of microwave energy to a process chamber 4 while vacuum sealing the process chamber 4. The process chamber 4 is composed of an outer cylinder 5 made of, for example, high purity aluminum (A1) and is capable of withstanding depressurization, and an inner cylinder 6 arranged inside the outer cylinder and made of ceramic, such as silicon carbide (SIC) or the like. Since the inside surface of the process chamber is formed of an insulator and the outer side is formed of a conductor, the process chamber 4 also serves as a waveguide. The reference character 7 designates a first solenoid coil for supplying a magnetic field, and the reference character 8 (8A, 8B) designates a second solenoid coil. The process chamber 4 is evacuated to vacuum by a vacuum pump connected to a vacuum chamber 9. The reference character 10 designates a sample table for mounting a wafer 11 to be processed, for example, to be etched, and connected to a high frequency power source 12. The reference character 13 designates a process gas supplying system which supplies a process gas for performing processing, such as etching, film forming or the like, into the process chamber 4.

There is a gap G14 having an interval of nearly 0.1 to 2 mm between the inner cylinder 6 and the outer cylinder 5, and a heat transfer gas for temperature control is introduced into the gap through a gas supply system 15. The gas supply system 15 has a gas source 16, a pressure control valve 17, a pressure detector 18, a pressure command instruction means 19 and a controller 20. The pressure P between the gap 14 is detected by the pressure detector 18 and the opening of the pressure control valve 17 is controlled so as to keep the pressure P at a desired value.

The inner cylinder 6 is supported by a supporter 32. In order to replace the inner cylinder when its surface is worn a certain amount, the inner cylinder is detachably supported by the outer cylinder.

A heater 21 for heating the process chamber 4 is arranged around the outer cylinder 5, and the temperature T of the inner cylinder 6 is detected by a temperature detector 23. A controller 22 controls the temperature of the outer cylinder 5 to a temperature $T_0$. The heater 21 works to maintain the temperature T of the inner cylinder 6 by keeping the temperature $T_0$ of the outer cylinder 5 and the pressure of the gap at preset values.

During plasma processing, the pressure of the process chamber 4 is adjusted to a preset process pressure by introducing a process gas into the process chamber 4 from the gas supply system 13 at a given flow rate while vacuum evacuating the chamber using the vacuum pump. Further, the temperature $T_0$ of the outer cylinder 5, the temperature T of the inner cylinder 6 and the pressure P of the gap 14 are controlled by the heater 21, the gas supply system 15 and the temperature controller 22.

A wafer 11 to be processed is mounted so as to be held on the sample table 10. The magnetron 1 and the first and the second coils 7, 8 are switched on, so that a microwave is guided to the process chamber 4, and then plasma 100 is generated in the process chamber 4 to etch the wafer 11.

According to the present invention, since no metallic surface, such as aluminum, forms an exposed inside wall of the process chamber 4, there is no possibility that a metal part will become worn and varied in quality, and so the wall cannot become a heavy metal contamination source to the wafer 11.

On the other hand, the SiC inner surface of the inner cylinder 6 is worn by plasma 100 bit by bit. However, since the SiC cylinder does not contains any heavy metal, there is no worry that the cylinder becomes a contamination source even if it is worn. On the contrary, since the inner surface of the inner cylinder is always renewed to a new surface as it is being worn, there is no worry about contamination due to varying the quality of the inside surface, and accordingly the characteristic of the process chamber 4 hardly varies with time. The worn SiC component is exhausted from the process chamber 4 by the vacuum pump.

The temperature of the inner cylinder is increased by heat generated in the process chamber during the etching process. If it is not controlled, the temperature T of the inner cylinder will reach up to 200° C. to 350° C. or higher. On the other hand, the etching characteristic in a plasma etching process is strongly affected by the temperature of the inside surface. In other words, since reaction between the inner cylinder 6 and the etching gas varies depending on the change in the surface temperature of the inner cylinder 6 and causes fluctuation in etching gas environment, the etching characteristic is not stabilized. For example, since the temperature change of the inner surface 6 causes the component, to fluctuate and the amount of accumulated materials on the wall and the change in the reaction speed with the wall causes the component in the plasma to fluctuate, the etching characteristic is not stabilized.

In accordance with the present invention, the surface temperature T of the inner cylinder is controlled to a desired value in the range of 100° C. to 350° C., preferably 150° C. to 300° C., by controlling the temperature $T_0$ of the outer cylinder 5 using the heater 21 and the pressure P in the gap 14. According to the present invention, since the surface temperature T of the inner cylinder 6 is kept at a preset value, the etching characteristic becomes stable. Further, since the surface temperature T of the inner cylinder 6 is kept at a preset value and the etching speed to the inside surface of the inner cylinder 6 is stabilized, the wearing rate of the surface of the inner cylinder 6, which is worn by the plasma, also becomes constant. Thereby, the characteristic of the process chamber 4 becomes stable.

Figure 3:
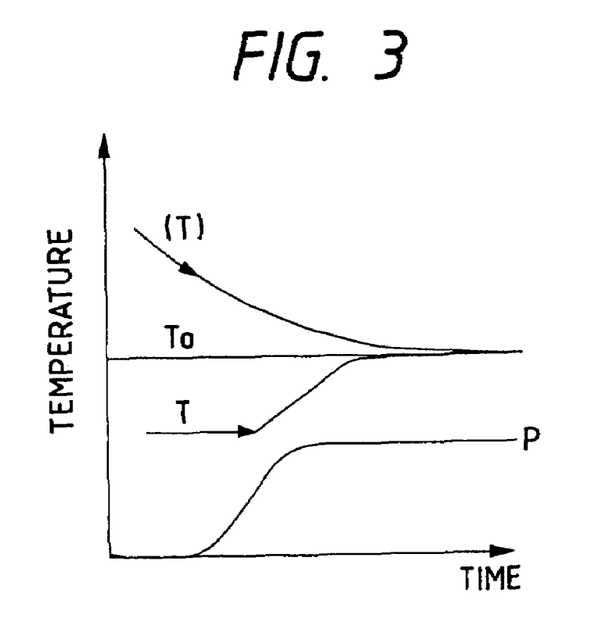
FIG. 3 is a graph showing the function of the temperature controller of FIG. 1.

FIG. 3 shows the function for controlling the temperature of the inner cylinder 6 as carried out by the temperature controller 22. As an example, the figure shows a case where the temperature T of the inner cylinder 6 is caused to approach $T_0$ by keeping the temperature of the outer cylinder 5 at $T_0$.

Figure 4:
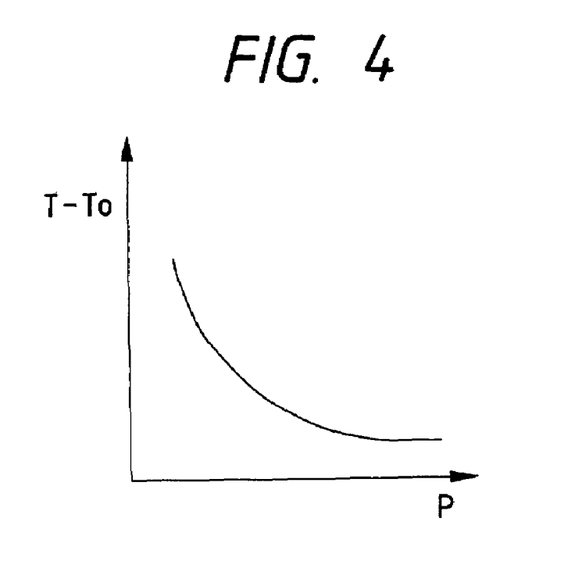
FIG. 4 is a graph showing the relationship between gap pressure P and temperature difference in the temperature control.

In this case, as shown in FIG. 4, the temperature difference between T and $T_0$ can be decreased by increasing the pressure P in the gap 14. In more detail, in a case where the distance of the gap 14 is 1 mm, He gas is supplied to the gap 14 and the gas pressure is controlled to 10 Torr; and, when the heat input to the inner cylinder 6 is 0 to 300 W, the temperature of the inner cylinder 6 can be kept in 150° C.±20° C. for an outer cylinder temperature of 150° C.

An optimum temperature for the inner cylinder differs depending on a combination of factors, including the kind of inner cylinder, the film quality to be processed, the kind of process gas being used, the discharge condition and so on.

Figure 12:
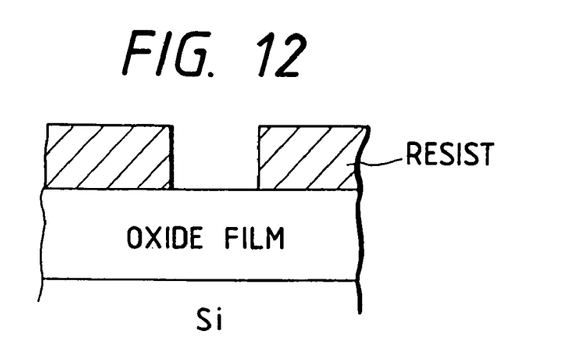
FIG. 12 is a vertical cross-sectional view showing an example of a sample to be processed with an apparatus in accordance of the present invention, the sample being a resist attached oxide film.
Figure 13:
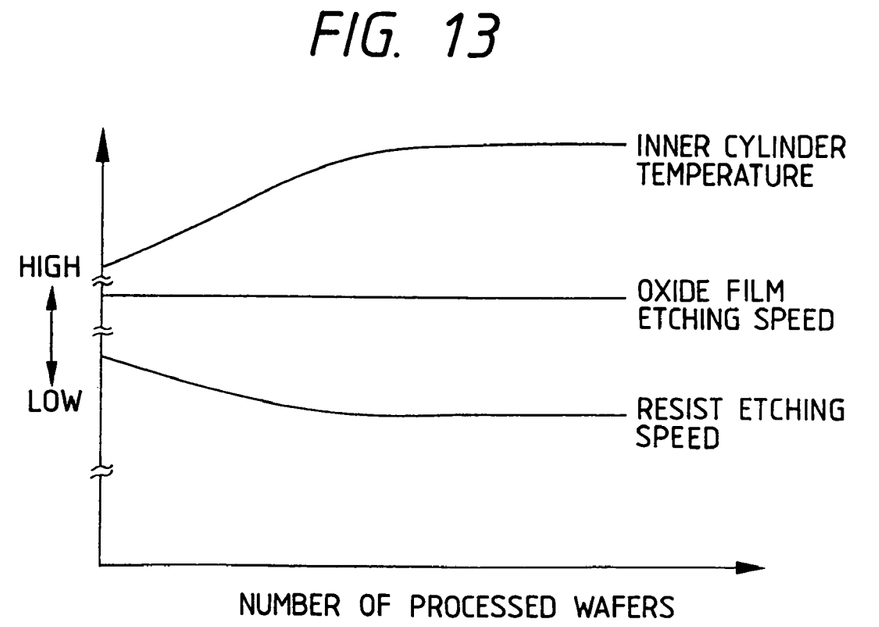
FIG. 13 is a graph showing the relationship between a number of processed wafers and the temperature of the inner cylinder.

In a case where, for example, a resist attached oxide film sample as shown in FIG. 12 is processed by using a CF family gas as the process gas and quartz as the material for the inner cylinder, when the temperature of the inner cylinder is not controlled, the temperature of the inner cylinder gradually increases as it receives heat from the plasma and eventually levels off to a certain temperature as the number of processed samples is increased, as shown in FIG. 13. Therein, although the change in the etching speed of the oxide film is small, the etching speed of the resist gradually decreases as the temperature of the inner cylinder increases and then the etching speed of the resist is stabilized when the temperature of the inner cylinder becomes saturated.

On the other hand, by maintaining the temperature of the inner cylinder at the saturating temperature of FIG. 13 in advance, a stable etching speed for the resist can be obtained from the first sheet of the processed samples.

In a case where the temperature of the inner cylinder is continuously being kept at an initial temperature, not at the saturating temperature shown in FIG. 13, the etching speed for the first sheet of the processed samples can be obtained.

The heat transfer capability of the gap is higher when the gap 14 is narrower, but the effect needed for the required temperature control can be achieved up to a gap of 2 mm.

The material of the inner cylinder 6 in this embodiment needs to be a non-magnetic material because of the microwave discharge using a magnetic field, and it should have the property that its quality will not be varied by plasma and it should not contain any heavy metals. As materials satisfying these conditions, there are carbon (C), silicon (Si), quartz (SiO), alumina ($Al_2O_3$) and so on. However, aluminum may be employed depending on the content of the plasma processing.

The inner cylinder 6 is required to have a mechanical strength above a certain value and durability. That is, the SiC cylinder forming the inner cylinder 6 in the embodiment must have sufficient a thickness to have a mechanical strength capable of withstanding an outer force acting during plasma processing, and it has to have a durability capable of withstanding a large amount of wafer processing while it is worn by plasma.

On the presumption that the SiC wall is worn at the rate of approximately 0.05 μm every minute by etching and the practical number of wafers processed by one inner cylinder is several ten thousands, an Sic wall thickness of 2 to 10 mm is sufficient.

In the embodiment shown in FIG. 1, it is preferable on the surface temperature of the quartz plate 3 to be also controlled to 100° C. to 350° C. in the same manner as the temperature control of the inner cylinder 6.

Figure 5:
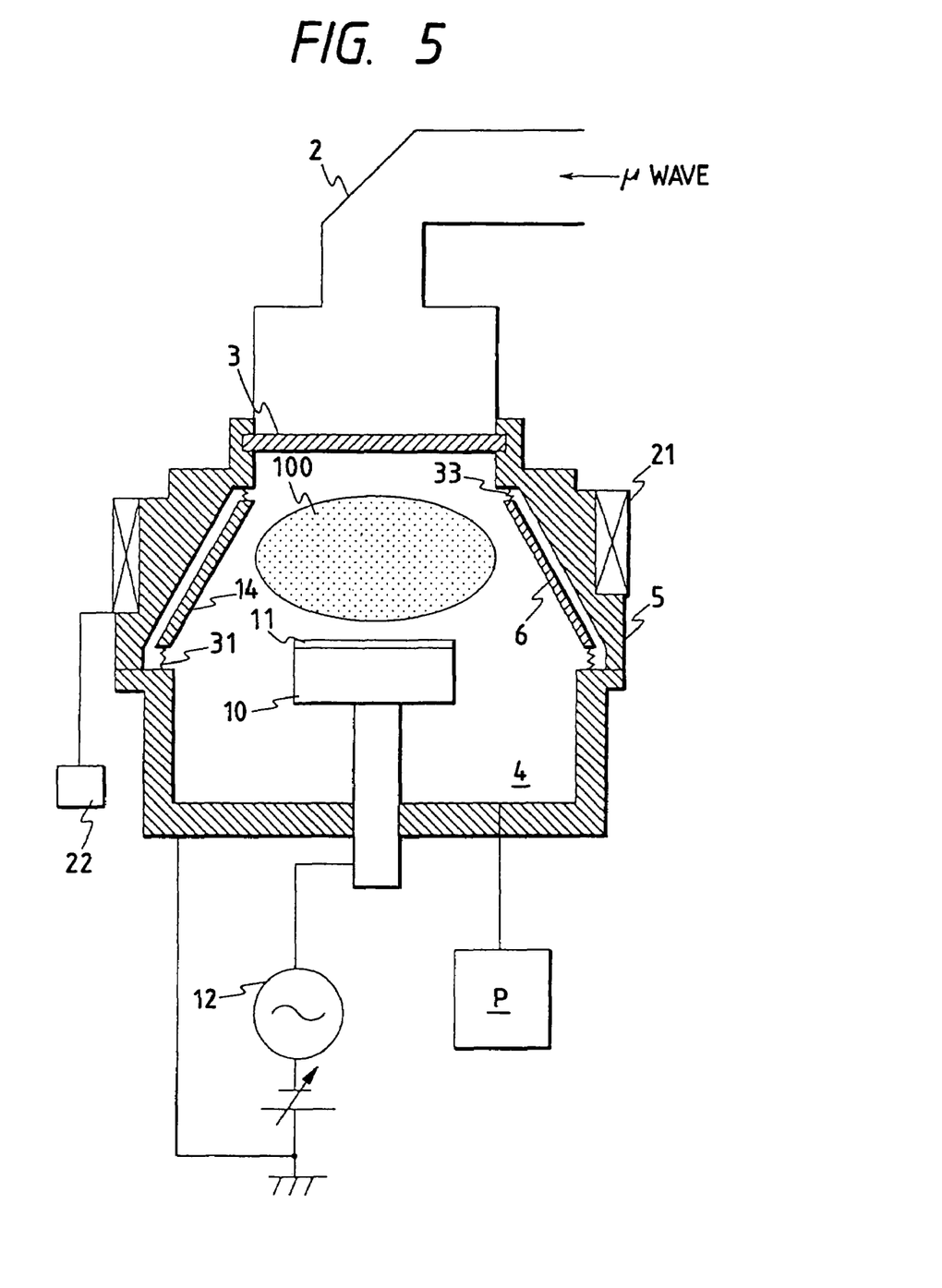
FIG. 5 is a vertical cross-sectional view showing a second embodiment of a microwave plasma processing apparatus in accordance with the present invention.
Figure 6:
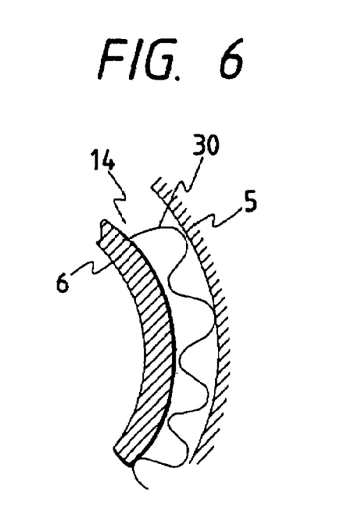
FIG. 6 is a transverse cross-sectional view showing the main part of the plasma processing apparatus of FIG. 5.

FIG. 5 is a vertical cross-sectional view showing another embodiment of a microwave plasma processing apparatus in accordance with the present invention. The process chamber 4 is constructed with an outer cylinder 5 formed of a highly pure aluminum and an inner cylinder 6 formed of a ceramic and arranged within the outer cylinder. The inside surface of the process chamber 4 is reversely taper shaped, and the inner cylinder 6 is truncated cone shaped. There is a gap 14 between the outer cylinder 5 and the inner cylinder 6. In the gap 14, a corrugated plate 30 made of aluminum is arranged, and the corrugated plate 30 contacts the outer cylinder 5 and the inner cylinder 6 with a spring force, as seen in FIG. 6. A heater 21 for heating is arranged around the periphery of the outer cylinder 5. The lower portion of the inner cylinder 6 is supported on a support member 32 through a spring 31. There is also a spring 33 in the upper portion of the inner cylinder 6. The contact force between the outer cylinder 5 and the inner cylinder 6 is increased by these springs 31, 33 and the corrugated plate 30. The springs 31, 33 also have a function to absorb any difference of thermal expansion between the outer cylinder 5 and the inner cylinder 6.

In this embodiment, the function of the inner cylinder 6 formed of SiC is the same as that in the previous embodiment. This embodiment is characterized by the fact that heat transmission between the outer cylinder 5 and the inner cylinder 6 is performed by a combination of contact heat transmission by the corrugated plate 31 and gas heat transmission by the gas inside the gap 14. According to the embodiment, the etching characteristic can be stabilized since the surface temperature 52 of the process chamber, that is, the temperature of the inner cylinder 6, can be kept at a temperature close to the temperature $T_0$ of the outer cylinder 5.

In the embodiments in FIG. 1 to FIG. 5, the temperature of the inner cylinder 6 may be detected indirectly, if it cannot be detected directly. However, the following effects can be obtained by attaching a temperature detector 23 to the inner cylinder 6.

(1) By making the pressure in the gap 14 variable or by finely adjusting the temperature of the outer cylinder 5 in order to control the temperature of the inner cylinder 6 more accurately, controllability of the inner cylinder temperature can be improved.

(2) By monitoring the temperature of the inner cylinder 6, it is possible to output an alarm signal, such as to indicate the need for stopping plasma processing or to quit plasma processing when the temperature of the inner cylinder 6 exceeds a preset range.

In the embodiments in FIG. 1 to FIG. 5, a heater is used as the temperature control function for the outer cylinder. However, by recirculating a temperature controlled liquid to the outer cylinder, it is possible to widen the temperature control range from a cooled state below room temperature to a heated state, and accordingly controllability of the inner cylinder temperature can be improved in this way.

Figure 7:
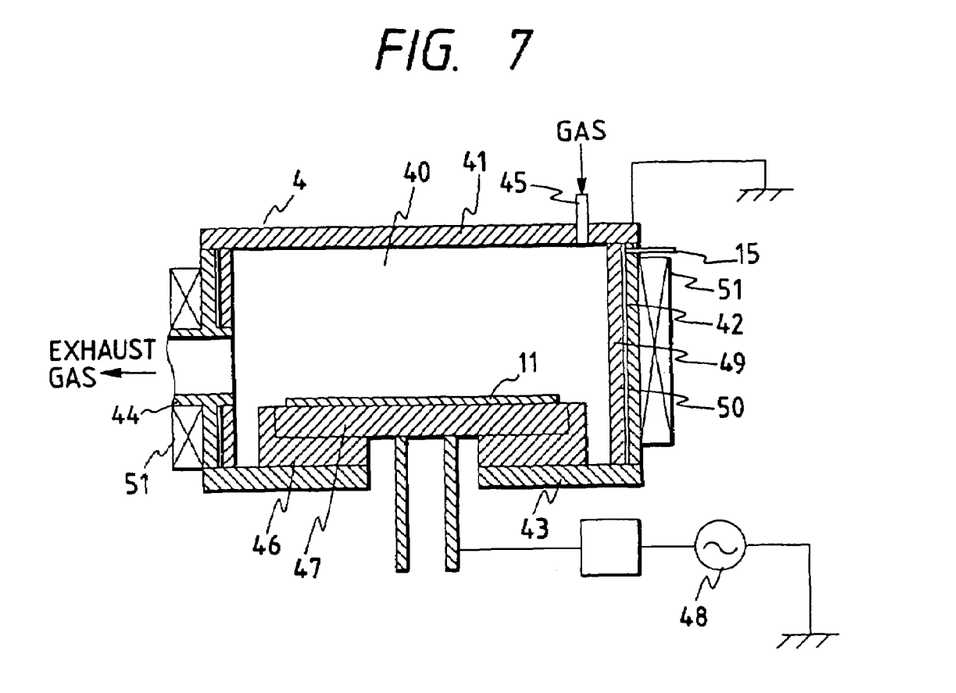
FIG. 7 is a vertical cross-sectional view showing a third embodiment of a parallel plate plasma etching apparatus in accordance with the present invention.

FIG. 7 shows another embodiment of a parallel plate plasma etching apparatus to which the present invention is applied. This apparatus has a vacuum chamber serving as a process chamber 4, which is a substantially closed metallic reaction chamber 40 constructed by an upper plate 41, a side wall 42 forming an outer cylinder and a bottom plate 43. In the vacuum chamber there is provided a pair of parallel plate electrodes facing each other, the anode 41 being grounded to the inside wall of the chamber 40 and the cathode 47 being mounted on the chamber 40 through an insulator 46, and there is also provided a high frequency power source 48 for supplying high frequency energy to the cathode 47. Further, there are provided a vacuum pump connecting part 44 for partially evacuating the process chamber 4 and a reaction gas supply source for supplying a reaction gas to the process chamber 4 through a valve controlled pipe 45. A wafer 11 to be etched is mounted on the cathode 47.

An inner cylinder 49 made of SiC is formed on the inside surface of the chamber 40, that is, on the upper plate 41, the side wall 42 and the bottom plate 43. There is a gap 50 between the side wall 42 and the inner cylinder 49, and a heat transfer gas for temperature control is introduced in the gap from a gas supply system. The gas supply system has a gas source, a pressure control valve, a pressure detector, a pressure command instruction means and a controller, and operates so as to maintain the pressure P in the gap 50 at a preset value, in the same manner as in the embodiment of FIG. 1. A heater 51 for heating the process chamber 4 is arranged around the outer periphery of the chamber 40, and the temperature $T_0$ of the side wall 42 is controlled by a temperature controller through the heater 51 and the temperature T of the inner cylinder 49 can be kept to a desired value, as described in the embodiment of FIG. 1. A temperature detector 23 may be attached to the inner cylinder 49.

With such a construction, by maintaining the temperature of the inner cylinder 49 at a preset value during plasma etching, it is possible to obtain the effect that the metal is not worn nor is its quality varied by the plasma in the same manner as in the embodiments described above. Further, since the inside surface of the inner cylinder 49 is always renewed to a new surface, there is no worry about contamination due to variation in the quality of the inside surface. Furthermore, since the temperature of the inner cylinder 49 is maintained at a preset value, it is possible to carry out a stable plasma processing. Herein, in the case of a parallel plate type etching apparatus, it is not necessary to limit the material of the inner cylinder to a non-magnetic material.

The present invention can be applied to other apparatuses having different plasma generating mechanisms. Examples of such applications are shown in FIG. 8 to FIG. 11.

Figure 8:
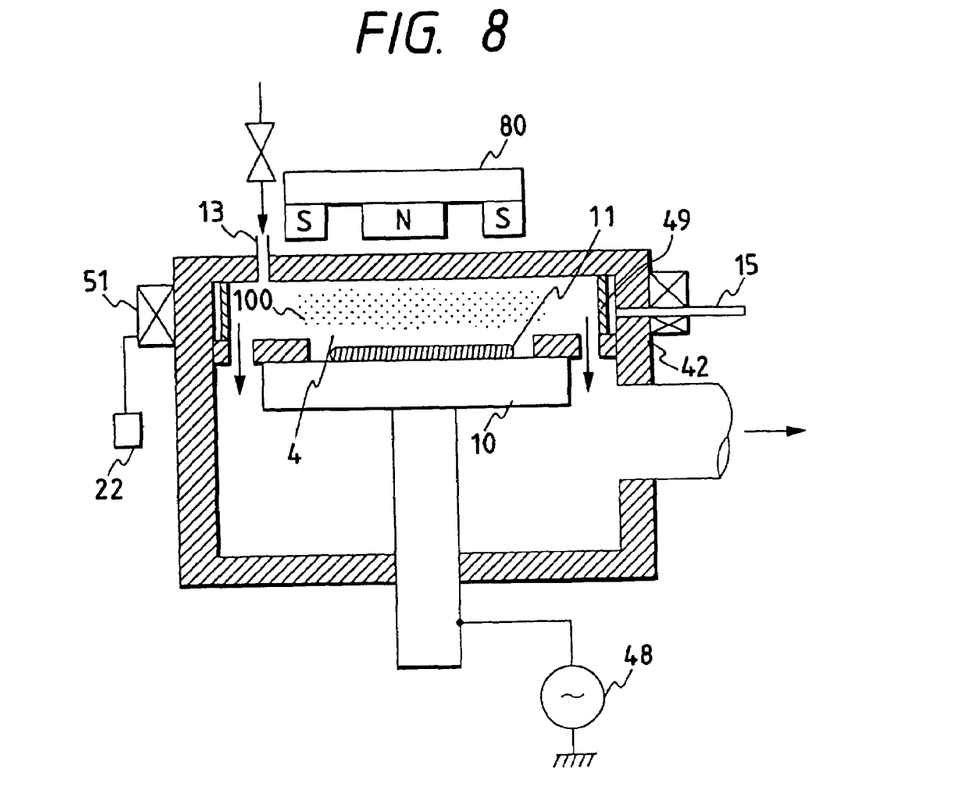
FIG. 8 is a cross-sectional view showing an example of a magnetron RIE apparatus to which the present invention is applied.

FIG. 8 shows an example of a magnetron RIE apparatus having a magnetron 80 to which the present invention is applied. A process chamber 4 of a vacuum chamber has a side wall 42, a sample table 10 for mounting a wafer 11 and a high frequency power source 48 for supplying high frequency energy to the electrode of the sample table 10. Further, there are a connection part to a vacuum pump for partially evacuating the process chamber 4 and a reaction gas supply source for supplying a reaction gas to the process chamber 4 through a valve controlled pipe 13.

An inner cylinder 49 made of SiC is disposed inside of the chamber 4 adjacent the surface of the side wall 42. There is a gap between the side wall 42 and the inner cylinder 49, and a heat transfer gas for temperature control is introduced in the gap from a gas supply system 15. The gas supply system has a gas source, a pressure control valve, a pressure detector, a pressure command instruction means and a controller, and operates so as to maintain the pressure P in the gap 50 at a preset value, in the same manner as in the embodiment of FIG. 1. A heater 51 for heating the process chamber 4 is arranged around the outer periphery of the side wall 42, the temperature $T_0$ of the side wall 42 being controlled by a temperature controller 22 through the heater 51 so that the temperature T of the inner cylinder 49 can be kept to a desired value, as described in the embodiment of FIG. 1.

With such a construction, by maintaining the temperature of the inner cylinder 49 at a preset value during plasma etching, it is possible to perform a stable plasma processing in the same manner as described in the above embodiment. Further, it is possible to obtain the effect that the metal is not worn nor varied in quality by the plasma. Further, since the inside surface of the inner cylinder 49 is always renewed to a new surface, there is no worry about contamination due to variation in the quality of the inside surface.

Figure 9:
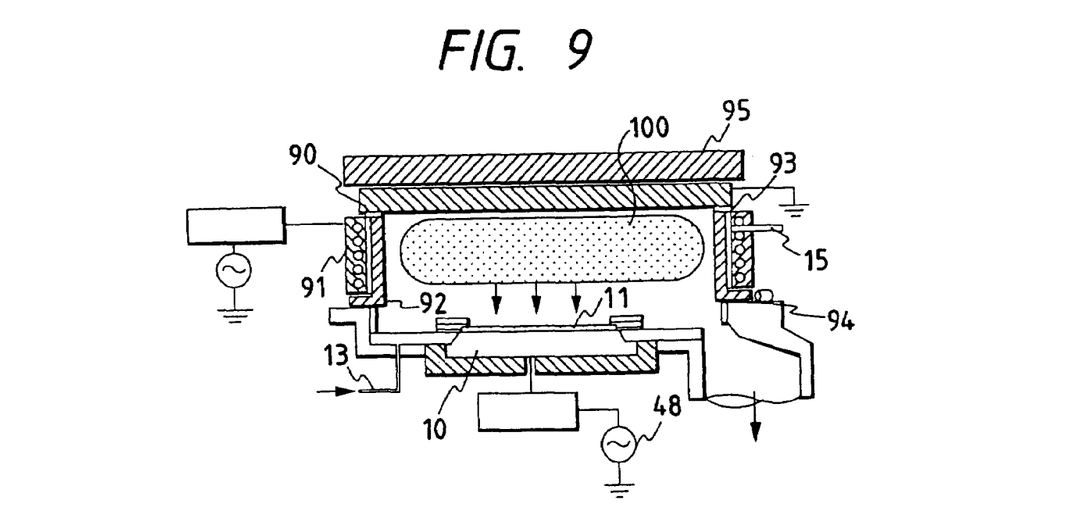
FIG. 9 is a cross-sectional view showing an example of a plasma processing apparatus to which the present invention is applied, the plasma processing apparatus being of an external energy supplying discharge type, and particularly of an induction coupling discharge type and a non-magnetic field type.

FIG. 9 shows an example of a plasma processing apparatus to which the present invention is applied, the plasma processing apparatus being of an external energy supplying discharge type, and particularly of an induction coupling discharge type and a non-magnetic field type. A process chamber 4 is formed by a silicon plate 90 and a quartz chamber 92. The reference character 91 denotes a heated antenna member and the reference character 95 designates an upper heater. In this embodiment, by maintaining the temperature of the quartz chamber 92 at a preset value during plasma etching, it is possible to perform a stable plasma processing by the same action described in the above embodiment. Further, it is possible to obtain the effect that the metal is not worn nor varied in quality by the plasma. Further, since the inside surface of the quartz chamber 92 is always renewed to a new surface, there is no worry about contamination due to variation in the quality of the inside surface.

Figure 10:
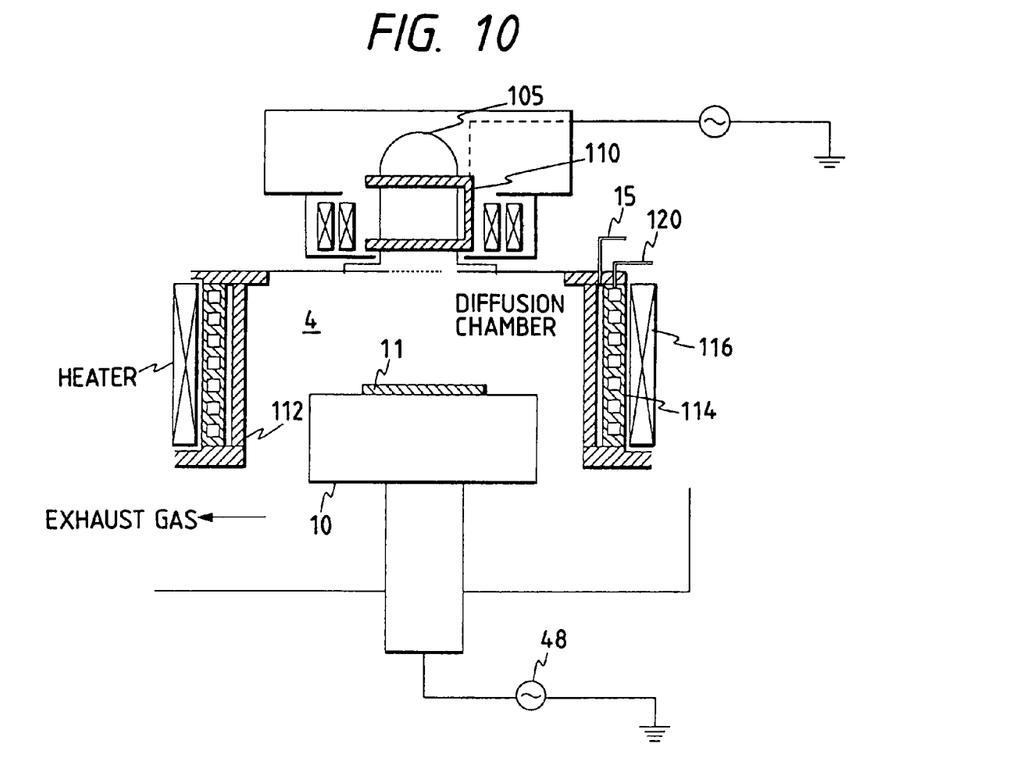
FIG. 10 is a cross-sectional view showing an example of a plasma processing apparatus to which the present invention is applied, the plasma processing apparatus being of an external energy supplying discharge type, and particularly of an induction coupling discharge type and a magnetic field type.

FIG. 10 shows an example of a plasma processing apparatus to which the present invention is applied, the plasma processing apparatus being of an external energy supplying discharge type, and particularly of an induction coupling discharge type and a magnetic field type. The reference character 105 denotes a bell jar and the reference character 110 designates an antenna. A process chamber 4 of a vacuum chamber has an inner cylinder 112, an outer cylinder 114, a sample table 10 for mounting a wafer 11 and a high frequency power source 48 for supplying high frequency energy to the electrode of the sample table 10. Further, there are a connection part to a vacuum pump for partially evacuating the process chamber 4 and a reaction gas supply source for supplying a reaction gas to the process chamber 4 through a valve controlled pipe. Furthermore, there are provided a heater 116 and a cooling water passage 120 for performing temperature control by heating and cooling the outer cylinder 114.

There is a gap between the inner cylinder 112 made of SiC and the outer cylinder 114, and a heat transfer gas for temperature control is introduced in the gap from a gas supply system 15. The gas supply system has a gas source, a pressure control valve, a pressure detector, a pressure command instruction means and a controller, and operates so as to maintain the pressure P in the gap at a preset value. The temperature $T_0$ of the outer cylinder 114 is controlled by a temperature controller through the heater 116 and the temperature T of the inner cylinder 112 can be kept to a desired value.

With such a construction, by maintaining the temperature of the inner cylinder 112 at a preset value during plasma etching, it is possible to perform a stable plasma processing by the same action described in the above embodiment. Further, it is possible to obtain the effect that the metal is not worn nor varied in quality by the plasma. Further, since the inside surface of the inner cylinder 49 is always renewed to a new surface, there is no worry about contamination due to variation in the quality of the inside surface.

Figure 11:
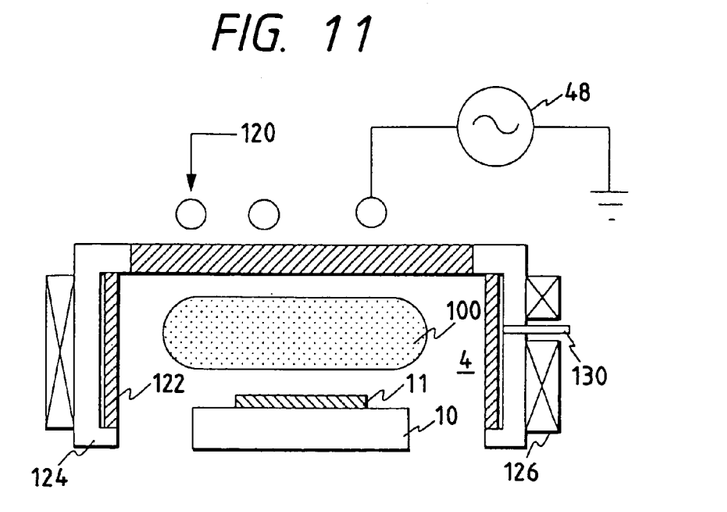
FIG. 11 is a cross-sectional view showing an example of a plasma processing apparatus to which the present invention is applied, the plasma processing apparatus being of an external energy supplying discharge type, and particularly of an induction coupling discharge type and a magnetic field type.

FIG. 11 shows an example of a plasma processing apparatus to which the present invention is applied, the plasma processing apparatus being of an external energy supplying discharge type, and particularly of an induction coupling discharge type and a magnetic field type. The reference character 120 denotes an electrode and the reference character 48 designates a high frequency power source. A process chamber 4 of a vacuum chamber has a ceramic plate 124, an inner cylinder 122, and a sample table 10 for mounting a wafer 11. Further, there are provided a heater 166 and a gas flow passage 130 for supplying a gas to the gap to perform temperature control by heating and cooling the ceramic plate 124. A gas supply system has a gas source, a pressure control valve, a pressure detector, a pressure command instruction means and a controller, and operates so as to maintain the pressure P in the gap at a preset value. The temperature $T_0$ of the ceramic plate 124 is controlled by a temperature controller through the heater 126 and the temperature T of the inner cylinder 122 can be kept to a desired value.

With such a construction, by maintaining the temperature of the inner cylinder 122 at a preset value, it is possible to perform a stable plasma processing by the same action described in the above embodiment. Further, it is possible to obtain the effect that the metal is not worn nor varied in quality by the plasma. Further, since the inside surface of the inner cylinder is always renewed to a new surface, there is no worry about contamination due to variation in the quality of the inside surface.

In each of the embodiments described in FIG. 8 to FIG. 11, it is preferable that a non-magnetic and non-metallic material be used for the material of the inner cylinder in order to decrease the effects of the magnetic field and the electric field.

The present invention can be applied not only to a plasma etching apparatus but also to a CVD apparatus or a spattering apparatus.

Further, application of the present invention is not limited to the case where a process is stabilized by maintaining the temperature of the inner cylinder to a preset value. The present invention can be also applied to, for example, a case where an initial process change for a lot is corrected by intentionally changing the temperature of the inner cylinder at the initial stage of the lot. That is, it is possible to stabilize a process by improving the temperature controllability for the inner cylinder.

The apparatuses described in FIG. 1 to FIG. 11 are used as follows.

Before starting operation of the apparatus, it is checked to determine whether or not the temperature of the inner cylinder can be controlled to a desired temperature.

Firstly, the inside of the process chamber 4 is evacuated to a preset pressure by action of the vacuum pump. Then, the heater is operated. The inner cylinder is heated by heat generation of the heater. During this period, a heat transfer gas is supplied to the gap and the gas pressure in the gap is adjusted to a preset pressure. That is, heating of the inner cylinder is performed by utilizing heat transfer of the heat transfer gas supplied to the gap. The temperature of the heated inner cylinder is directly or indirectly detected and controlled to a desired temperature. By doing so, it can be confirmed that the temperature of the inner cylinder can be controlled to the desired temperature. If the temperature of the inner cylinder cannot be controlled to the desired temperature, operation of the heater is stopped and supply of the heat transfer gas to the gap is stopped. Then, the cause of the trouble is checked and repaired.

In the above case, one wafer is introduced into the process chamber using a transfer machine which is not shown in the figures. The introduced wafer is transferred from the transfer machine to the sample table and mounted on a sample mounting surface so that the surface opposite to the surface to be processed is facing the sample mounting surface. In the apparatuses described with reference to FIG. 1 to FIG. 11, a temperature control means having a cooling function is provided at the sample table. In a CVD apparatus or a spattering apparatus which requires to heat a wafer during processing, a temperature control means having a heating function is provided at the sample table. The wafer mounted on the sample mounting surface of the sample table is held on the sample table by a mechanical clamping means utilizing a spring force or gravitational force, an electrostatic attracting means, a vacuum sucking means or the like.

Then, a process gas is introduced into the process chamber with a preset flow rate. A part of the process gas introduced in the process chamber is exhausted out of the process chamber by the operating vacuum pump. By doing so, the pressure inside the process chamber is adjusted to a processing pressure of the wafer.

Under such a condition, the process gas in the process chamber is changed to a plasma by discharge. The surface of the wafer mounted on the sample table is processed by plasma. During processing, the temperature of the wafer is controlled at a preset temperature.

During processing, the temperature of the inner cylinder is monitored continuously or when required. The monitored temperature is compared with a preset desired temperature, and the temperature of the inner cylinder is controlled to the desired temperature based on the result of the comparison. The temperature control of the inner cylinder is performed by adjusting the pressure of the heat transfer gas in the gap between the inner cylinder and the outer cylinder or by adjusting the temperature of the outer cylinder by adjusting the heat being generated by the heater. The pressure adjusting of the heat transfer gas in the gap between the inner cylinder and the outer cylinder is performed by adjusting the supply flow rate or the pressure of the heat transfer gas supplied to the gap.

In general, plural wafers are continuously processed one by one. In such a case, the temperature of the inner cylinder is monitored while processing one wafer among them until processing for the all plural wafers is completed to control the temperature to the desired temperature. For example, when trouble occurs in the temperature monitoring of the inner cylinder or when the temperature of the inner cylinder cannot be controlled to the desired temperature, it is judged that the processing characteristic of the wafer cannot be maintained stable and the wafer processing is stopped. Then, an effort is made to solve the problem, and the successive process for plural wafers is re-started.

The fact that trouble occurs in the temperature monitoring of the inner cylinder or that the temperature of the inner cylinder cannot be controlled to the desired temperature is indicated to an operator by output of some kind of alarm through the controller. In response to the alarm, the operator solves the trouble and re-starts the wafer processing. By monitoring the temperature control of the inner cylinder, the history of the processing up until the stopping of the wafer processing can be checked, and consequently the search of the cause and the repairing method can be performed properly and fast.

A cleaning process is performed for the inside of the process chamber. The process is performed by wiping the inside surface of the process chamber, such as the surface of the inner cylinder, and the surfaces of parts arranged inside the process chamber, such as the sample table, or by utilizing a cleaning gas plasma. The process is performed before a wafer processing, in the intervals between processings, or after completion of a wafer processing.

In a case of performing a cleaning process by wiping, it is checked whether the temperature of the inner cylinder can be controlled during a period after completion of the cleaning processing and before the starting of a wafer processing. On the other hand, in a case of performing a cleaning process by utilizing a plasma, it is checked whether the temperature of the inner cylinder can be controlled during the cleaning processing or during a period after the cleaning process and before starting of a wafer processing.

Further, a discharge running-in (seasoning) process is performed for the inside of the process chamber. The seasoning process is performed before starting a wafer processing at the beginning of a day, or during a period after completion of a cleaning processing and before starting of a wafer processing. In this case, it may be checked during the seasoning process whether the temperature of the inner cylinder can be controlled or not.

In order to stabilize the characteristic of plasma processing over time, it is necessary to control the temperature of the inner cylinder to a temperature corresponding to a wafer processing condition. Here, the wafer processing conditions include the quality of film to be processed, the kind of processing gas to be used, the condition of discharge, the type of discharge and so on.

Therefore, wafer processing conditions are input to the controller of the processing apparatus from a higher level controlling unit or an operator. The controller has received an indication of the temperature of the inner cylinder corresponding to each of the wafer processing conditions. In the controller, the temperature of the inner cylinder corresponding to the input wafer processing condition is selected and set as a control temperature. On the other hand, a detected and monitored temperature of the inner cylinder is input to the controller. The detected and monitored temperatures are compared with the control temperature, and the temperature of the inner cylinder is controlled to the control temperature based on the result of comparison.

Further, in a case where the wafer is, for example, of a multi-layer film structure, the temperature of the inner cylinder may be controlled to a temperature corresponding to that set for the quality of each film, the kind of process gas, the condition of discharge and so on. By doing so, the characteristic of plasma processing can be finely stabilized over time.

In a case where a wafer processing performance is varied during one lot processing after a running-in discharge (seasoning) process, the temperature of the inner cylinder may be varied along a desired temperature pattern in order to make the processing performance uniform.

Although the above description has been directed to the temperature control of the inner cylinder inside the chamber, the present invention can be similarly applied to the temperature control of the sample table cover arranged around the sample table.

Figure 14:
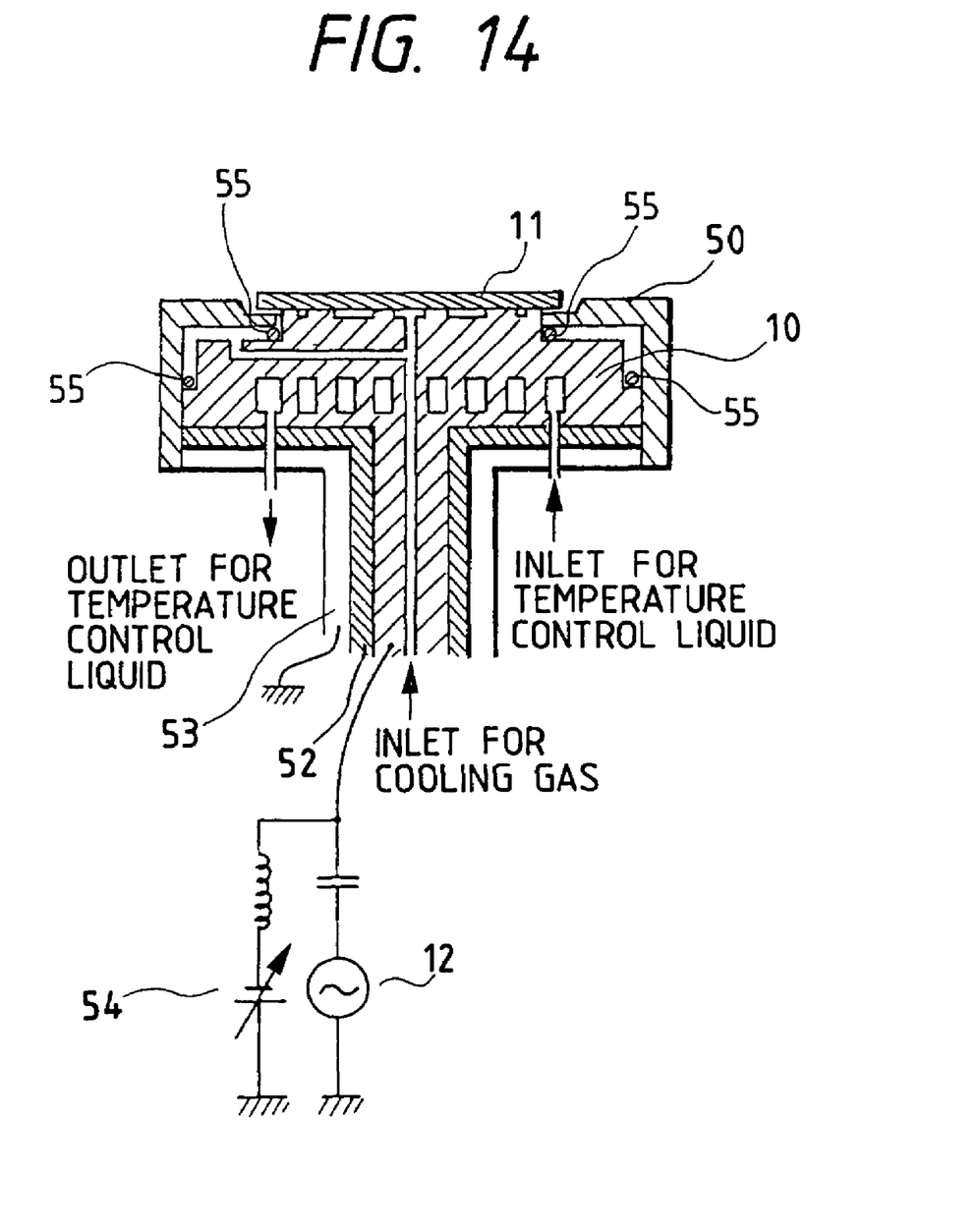
FIG. 14 is a cross-sectional view showing an embodiment of a sample table cover portion of a plasma processing apparatus to which the present invention is applied.

FIG. 14 is a cross-sectional view showing an embodiment of a sample table cover portion of a plasma processing apparatus to which the present invention is applied. A liquid for temperature control is recirculated inside a sample table 10, so that an insulator applied onto the surface of the sample table will be maintained at a desired temperature, and a sample 11 is attracted to the sample table 10 by an electrostatic force using an direct current power source 54 for providing an electrostatic chuck under a condition wherein a discharge exists in the processing chamber. A heat transfer gas, for example, helium gas is introduced between the sample 11 and the sample table 10 in order to increase the thermal conductance. A sample table cover made of an insulator, such as alumina or the like, or a resistive material, such as SiC or the like, is arranged in the upper portion of the sample table 10 to prevent discharge of undesired metals when the metallic sample table 10 is exposed to a plasma. The temperature of the sample table cover is raised as ions and radicals in the plasma collide with the surface of the sample table cover 50. When the temperature of the sample table cover 50 near the sample is varied, there is a disadvantage in that chemical-physical reaction is varied, and consequently the processing characteristic of the sample is varied. Therefore, a gas sealing means 55, for example, an O-ring, is provided between the sample table 10 and the sample table cover 50, and a heat transfer gas is introduced between the sample table 10 and the sample table cover 50. The pressure control and its related system are the same as in the case of the inner cylinder. Although the heat transfer gas for cooling a sample is also used for the heat transfer gas for cooling the sample table cover in FIG. 14, needless to say, the gas may be separately supplied.

According to the present invention, the temperature of the inner cylinder which directly contacts the plasma can be controlled, and the change in the characteristic of the plasma processing can be controlled over time.

Further, according to the present invention, it is possible to provide a plasma processing apparatus and a plasma processing method having a stable plasma processing characteristic which can avoid heavy metal contamination caused by use of a non-magnetic and conductive metallic material to form the process chamber, which is subjected to being worn and having its quality varied by plasma, and under a condition that the wall surface of the process chamber is not chemically corroded by the reaction gas used inside the process chamber.

What is claimed is:

1. A plasma processing apparatus for processing a specimen comprising: a process chamber capable of having an inside pressure thereof reduced, the process chamber including an outer cylinder having a metallic surface and having the capability of withstanding a reduced pressure, and an inner cylinder arranged inside the outer cylinder so as to delimit a gap between the outer cylinder and the inner cylinder, the inner cylinder being made of non-magnetic material and being detachably connected to the outer cylinder so as to be detachable from the outer cylinder; a process gas supply unit for supplying gas to the process chamber; a plasma generating unit for generating a plasma inside of the inner cylinder of the process chamber; a heat transfer gas supply system for supplying heat transfer gas into the gap; a pressure controller for controlling pressure in the gap so as to control a temperature difference between the outer cylinder and the inner cylinder; a specimen table disposed inside of the inner cylinder for holding a specimen; a vacuum pumping unit for evacuating the process chamber; a temperature monitoring unit for monitoring a temperature of the inner cylinder; and a temperature controller configured to control a temperature of the outer cylinder using a heater mounted on the outer cylinder, the temperature controller enabling comparison of a predetermined inner cylinder temperature which is given in advance in response to a processing condition of the specimens with the monitored temperature of the inner cylinder and for controlling the temperature of the outer cylinder in response to a result of the comparison so as to control the inner cylinder temperature to the predetermined inner cylinder temperature.

2. The plasma processing apparatus according to claim 1, wherein the predetermined inner cylinder temperature is given in advance in response to a processing condition of a lot of the specimens, and the temperature controller is configured to control the temperature of the outer cylinder in response to the result of the comparison so as to correct the inner cylinder temperature at the initial stage of processing of the lot.

3. The plasma processing apparatus according to claim 1, wherein the temperature controller is configured to control the temperature of the outer cylinder in response to the result of the comparison so as to control the inner cylinder temperature to the predetermined inner cylinder temperature so as to make a constant processing performance of the specimens during one lot processing.

4. The plasma processing apparatus according to claim 1, wherein a cleaning processing is carried out under utilization of a cleaning gas plasma one of before plasma processing for the specimen, during plasma processing for a plurality of specimens and after plasma processing for the specimen; wherein the temperature monitoring unit monitors the temperature of the inner cylinder after the cleaning processing and before starting of the plasma processing for the specimen; and wherein the temperature controller is configured to control the temperature of the outer cylinder in response to the result of the comparison so as to control the temperature of the inner cylinder to the predetermined inner cylinder temperature.

* * * * *